United States Patent
Oh et al.

(10) Patent No.: US 8,969,864 B2
(45) Date of Patent: Mar. 3, 2015

(54) ORGANIC LIGHT EMITTING DEVICE HAVING A BULK LAYER COMPRISING A FIRST AND SECOND MATERIAL

(71) Applicant: Samsung Display Co., Ltd., Yongin, Gyeonggi-Do (KR)

(72) Inventors: Il-Soo Oh, Yongin (KR); Chang-Ho Lee, Yongin (KR); Hee-Joo Ko, Yongin (KR); Se-Jin Cho, Yongin (KR); Hyung-Jun Song, Yongin (KR); Jin-Young Yun, Yongin (KR); Bo-Ra Lee, Yongin (KR); Young-Woo Song, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/052,353

(22) Filed: Oct. 11, 2013

(65) Prior Publication Data

US 2014/0353604 A1 Dec. 4, 2014

(30) Foreign Application Priority Data

May 30, 2013 (KR) ........................ 10-2013-0062056

(51) Int. Cl.
*H01L 29/08* (2006.01)
*H01L 29/06* (2006.01)
*H01L 29/15* (2006.01)
*H01L 27/108* (2006.01)
*H01L 51/52* (2006.01)

(52) U.S. Cl.
CPC .................... *H01L 51/5212* (2013.01)
USPC .................. 257/40; 257/13; 257/76; 257/296

(58) Field of Classification Search
CPC .............. H01L 51/002; H01L 51/0545; H01L 51/0036; H01L 51/0541; H01L 51/5012; H01L 51/5092; H01L 51/5221; B82Y 10/00
USPC ................... 257/40, 4, 76, 296, 101–103, 13; 428/690; 438/46

See application file for complete search history.

(56) References Cited

U.S. PATENT DOCUMENTS

| | | | |
|---|---|---|---|
| 6,208,077 B1 * | 3/2001 | Hung | 313/506 |
| 6,248,458 B1 * | 6/2001 | Yoon et al. | 428/690 |
| 6,797,129 B2 | 9/2004 | Raychaudhuri et al. | |
| 7,732,062 B1 * | 6/2010 | Hsu et al. | 428/690 |
| 2003/0152801 A1 * | 8/2003 | Liao et al. | 428/690 |
| 2003/0224203 A1 * | 12/2003 | Raychaudhuri et al. | 428/690 |
| 2006/0125379 A1 | 6/2006 | Liu et al. | |
| 2008/0111481 A1 * | 5/2008 | Seo et al. | 313/504 |
| 2008/0152787 A1 * | 6/2008 | Cina | 427/66 |
| 2009/0206747 A1 * | 8/2009 | Li et al. | 313/504 |

FOREIGN PATENT DOCUMENTS

| | | |
|---|---|---|
| JP | 2007-200662 | 8/2007 |
| KR | 10-2005-0102360 A | 10/2005 |
| KR | 10-2008-0001183 A | 1/2008 |

* cited by examiner

*Primary Examiner* — Long K Tran
*Assistant Examiner* — Dzung Tran
(74) *Attorney, Agent, or Firm* — Innovation Counsel LLP

(57) ABSTRACT

Disclosed is an organic light emitting diode device including an anode, a cathode, an emission layer between the anode and the cathode, and a buffer layer positioned between the emission layer and the anode. The buffer layer includes an oxide, fluoride, quinolate, or acetoacetate compound of an alkaline metal or an alkaline-earth metal, as well as a material having a work function of about 2.6 to about 4.5 eV. The buffer layer also has a thickness of about 30 Å to about 400 Å.

9 Claims, 2 Drawing Sheets

ORGANIC LIGHT EMITTING DEVICE HAVING A BULK LAYER COMPRISING A FIRST AND SECOND MATERIAL

This application claims priority to, and the benefit of, Korean Patent Application No. 10-2013-0062056 filed in the Korean Intellectual Property Office on May 30, 2013, the entire contents of which are incorporated herein by reference.

BACKGROUND

1. Field

Aspects of the disclosure relate generally to organic light emitting diode devices. More specifically, aspects of the disclosure relate to organic light emitting diode devices having improved transmittance.

2. Description of the Related Art

As organic light emitting diode devices have good light emitting characteristics and do not require separate light sources unlike liquid crystal displays (LCDs), such devices can be used in producing thinner, lighter-weight displays. And since an organic light emitting diode device exhibits desirable characteristics such as low power consumption, high luminance, high reaction speed, and the like, it is often a desirable candidate for use in next generation display devices.

An organic light emitting diode device includes a plurality of organic light emitting elements each having a hole injection electrode, an organic emission layer, and an electron injection electrode. In the organic emission layer, light emission is achieved by energy released when excitons generated by combination of electrons and holes drop from the exited state to the ground state, and the organic light emitting diode device forms an image therewith.

SUMMARY

One embodiment provides a large-area organic light emitting diode device having improved performance.

According to one embodiment, an organic light emitting diode device includes an anode, a cathode, an emission layer between the anode and the cathode, and a buffer layer positioned between the emission layer and the anode. The buffer layer comprises a first material including an oxide, fluoride, quinolate, or acetoacetate of an alkaline metal or an alkaline-earth metal, as well as a second material having a work function of about 2.6 to about 4.5 eV. The buffer layer further has a thickness of about 30 Å to about 400 Å.

The buffer layer may have amounts of the first material and the second material in a weight ratio having a range from about 1:4 to about 4:1.

The second material may include any one or more of ytterbium (Yb), aluminum (Al), silver (Ag), and magnesium (Mg).

The first material may include at least one of LiF, NaF, NaCl, CsF, $Li_2O$, BaO, and lithium quinolate.

The organic light emitting diode device may further include a hole injection layer (HIL) doped with P-type material, the HIL being positioned between the buffer layer and the emission layer.

The anode may be a transparent conductive layer comprising one or more of a transparent conductive oxide, and a semi-transparent conductive layer having a thickness of about 8 nm to about 30 nm and including aluminum (Al), an aluminum-alloy (Al-alloy), silver (Ag), a silver-alloy (Ag-alloy).

The organic light emitting diode device may further include at least one organic layer selected from a hole injection layer (HIL), a hole transport layer (HTL), an electron blocking layer (EBL), a hole blocking layer (HBL), an electron transport layer (ETL), and an electron injection layer (EIL).

The organic light emitting diode device has improved luminous efficiency and driving characteristics, and the anode may be manufactured by sputtering so as to reduce damage incurred during manufacture of large-area device.

DETAILED DESCRIPTION

Figure 1:
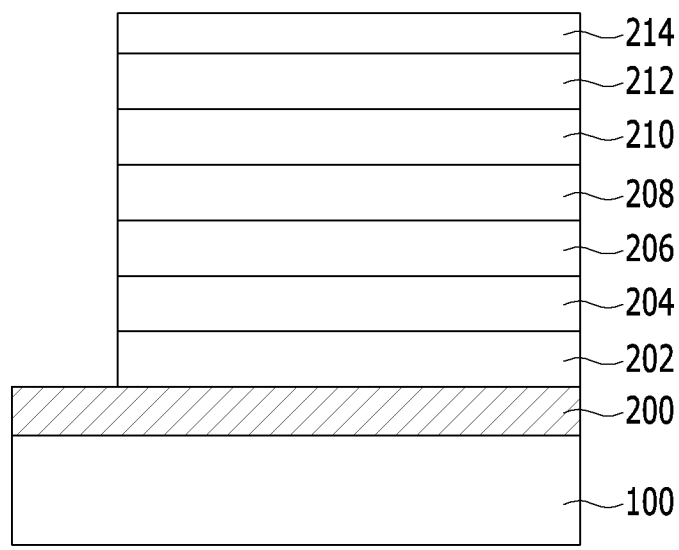
FIG. 1 is a schematic cross-sectional view showing an organic light emitting diode device according to one embodiment.

Hereinafter, the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

A part having no relationship with the description is omitted for clarity, and the same or similar constituent element is indicated by the same reference numeral throughout the specification. A layer described as being "on" another layer may be positioned directly on or contacting that layer, or may be positioned so that one or more intervening layers may be present.

The size and thickness of each constituent element as shown in the drawings can be exaggerated for better understanding and ease of description, and the present invention is not necessarily limited as shown. The various drawings are not necessarily to scale. All stated numerical values are approximate, and may vary.

Hereinafter, an organic light emitting diode device according to one embodiment of the present invention is described with reference to FIG. 1.

FIG. 1 is a schematic cross-sectional view of an organic light emitting diode device according to one embodiment. As shown in FIG. 1, the organic light emitting diode device includes a substrate 100, a lower electrode 200 formed on the substrate 100, an emission layer 206 formed on the lower electrode 200, a buffer layer 212 formed on the emission layer 206, and an upper electrode 214 formed on the buffer layer 212.

One of the lower electrode 200 and upper electrode 214 may be an anode and the other one may be a cathode. For example, the lower electrode 200 may be a cathode and the upper electrode 214 may be an anode.

The buffer layer 212 includes an oxide, fluoride, quinolate, or acetoacetate of an alkaline metal or an alkaline-earth metal, and material having a work function of about 2.6 to about 4.5 eV.

The buffer layer 212 includes a material having transmittance, and may improve luminous efficiency.

The buffer layer 212 may have a thickness of about 30 Å to about 400 Å. Since the buffer layer 212 is relatively thin, driving characteristics may be improved. Also, this thickness range may help reduce damage to the organic material of underlying organic layers while also improving the efficiency of the organic light emitting diode device.

The buffer layer 212 includes a material having a relatively low work function, and thus makes electron injection into an emission layer easy. This improves light transmittance by decreasing a refractive index and an absorption rate in a visible wavelength region.

Specific examples of the oxide, fluoride, quinolate, or acetoacetate of an alkaline metal or an alkaline-earth metal may include LiF, NaF, NaCl, CsF, $Li_2O$, BaO, lithium quinolate, or any combination thereof, but are not limited thereto. The buffer layer 212 may be made of any suitable material.

The material having a work function of about 2.6 to about 4.5 eV may be specifically ytterbium (Yb), aluminum (Al), silver (Ag), magnesium (Mg), and/or a combination thereof such as an alloy of magnesium and silver (Mg/Ag), but is not limited thereto.

The buffer layer 212 may protect organic materials included in an organic light emitting diode device from damage during sputtering, since the organic materials may be decomposed during sputtering. For example, the buffer layer 212 is present before the upper electrode 214 is formed, and thus may prevent the organic materials of underlying organic layers from incurring damage when the upper electrode 214 is sputtered. In this way, since the buffer layer decreases the sputtering damage, the upper electrode may be formed through a sputtering process when a large-area device is manufactured.

The buffer layer 212 may include the oxide, fluoride, quinolate, or acetoacetate compound of an alkaline metal or an alkaline-earth metal, and the material having a work function of about 2.6 to about 4.5 eV, in a weight ratio from about 1:4 to about 4:1. The buffer layer 212 includes a material having a work function ranging from about 2.6 to about 4.5 eV and an oxide, fluoride, quinolate, or acetoacetate of an alkaline metal or an alkaline-earth metal. It thus may have a lower dielectric constant ($\kappa$) and, in addition, an appropriate dielectric constant ($\kappa$) when the materials are included within the above ratio, and therefore may lower an absorption rate and achieve a desirable degree of luminous efficiency. The buffer layer 212 may have a dielectric constant ($\kappa$) of, for example, less than or equal to about 0.1.

The upper electrode 214 may be a transparent conductive layer or a semi-transparent conductive layer. The transparent conductive layer may be an electrode made of, for example, a transparent conductive oxide, and the transparent conductive oxide may be an electrode made of, for example, indium tin oxide (ITO), indium zinc oxide (IZO), or the like. The semi-transparent conductive layer may be a thin metal layer, for example aluminum (Al), an aluminum-alloy (Al-alloy), silver (Ag), a silver-alloy (Ag-alloy), or a combination thereof, and may have a thickness of about 8 nm to about 30 nm.

The emission layer 206 may be made of an organic material emitting one light among primary colors such as red, green, blue, and the like, or a mixture of an inorganic material with the organic material, for example, a polyfluorene derivative, a (poly)paraphenylenevinylene derivative, a polyphenylene derivative, a polyfluorene derivative, polyvinylcarbazole, a polythiophene derivative or a compound prepared by doping these polymer materials with a perylene-based pigment, a cumarine-based pigment, a rothermine-based pigment, rubrene, perylene, 9,10-diphenylanthracene, tetraphenylbutadiene, Nile red, coumarin, quinacridone, and the like. An organic light emitting diode device displays a desired image by a spatially-distributed combination of primary colors emitted by an emission layer therein.

The organic light emitting diode device may include any one or more of an electron transport layer (ETL) and a hole transport layer (HTL) in order to adjust balance electrons and holes between the emission layer 206 and buffer layer 212 or the emission layer 206 and lower electrode 200, as well as an electron injection layer (EIL) and a hole injection layer (HIL) in order to enforce injection of electrons and holes.

FIG. 1 shows an organic light emitting diode device that has the charge transport layer 208 and the charge injection layer 210 stacked on the emission layer 206, and the buffer layer 212 stacked thereon. In addition, the organic light emitting diode device of FIG. 1 includes the charge injection layer 202 and the charge transport layer 204 stacked on the lower electrode 200, and the emission layer 206 stacked thereon. The charge transport layers 204 and 208, and the charge injection layers 202 and 210, may be differently stacked depending on an anode and a cathode. For example, when the lower electrode 200 is a cathode and the upper electrode 214 is an anode, the charge injection layer 202, the charge transport layer 204, the charge transport layer 208, and the charge injection layer 210 may be respectively an electron injection layer (EIL), an electron transport layer (ETL), a hole transport layer (HTL), and a hole injection layer (HIL).

The charge injection layer 210 may include an organic material doped with a P-type material, and may improve driving voltage and luminous efficiency of an organic light emitting diode device when included with the above-described buffer layer 212. The organic material doped with a P-type material may be a charge-injecting material with a dopant having a substituent such as —F, —CN, and the like having very high electron affinity. The charge-injecting material may be electron-injecting material or hole-injecting material. The dopant is used with the organic material and increases charge carrier density as well as improving charge injection ability.

Non-limiting examples of the charge-injecting material may be copper phthalocyanine (CuPc) or Starburst-type amines. Non-limiting examples of the charge transport material may be 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl) triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N'-di (naphthalen-1-yl)-N,N'-diphenyl benzidine ($\alpha$-NPD), N,N'-diphenyl-N,N'-bis(1-naphthyl)-(1,1'-biphenyl)-4,4'-diamine (NPB), IDE320 (manufactured by Idemitsu Kosan Co., Ltd.), poly(9,9-dioctylfluorene-co-N-(4-butylphenyl)diphenylamine) (TFB), or poly(9,9-dioctylfluorene-co-bis-N,N-phenyl-1,4-phenylenediamine (PFB), and the like.

The substrate 100 may be made of a glass substrate, a silicon wafer, a polymer film, and the like, and the lower electrode 200 is formed on the substrate 100.

The lower electrode 200 may be a transparent conductive layer or an opaque conductive layer. Transparent conductive layer may be made of, for example, a transparent conductive oxide such as ITO, IZO, and the like, and the opaque conductive layer may be made of, for example a metal such as aluminum (Al), copper (Cu), molybdenum (Mo), silver (Ag), or a combination thereof. When the lower electrode 200 is an opaque electrode, top emission (where light is emitted toward the opposite side of the substrate) is realized, while when the lower electrode 200 is transparent electrode, both side emission where light is emitted toward the substrate 100 and opposite to the substrate 100 is realized.

Hereinafter, the present disclosure is illustrated in more detail with reference to examples. However, these examples are exemplary, and the present disclosure is not limited thereto.

Manufacture of Organic Light Emitting Diode Device

Example 1

A cathode was formed by stacking MgAg and patterning it on a glass substrate, a hole injection layer (HIL) was formed by depositing CuPc and F4-TCNQ on the cathode, a hole transport layer (HTL) was formed by depositing NPB on the hole injection layer (HIL), an emission layer was formed through codeposition by doping Alq3 (tris_8-hydroxyquinoline_aluminum) with 1 wt % of coumarin 6, and then an electron transport layer (ETL) was formed on the emission layer by depositing Bepq2. Subsequently, a 30 Å thick buffer layer was formed by depositing ytterbium (Yb) and LiF in a ratio of 1:1 on the electron transport layer (ETL), and an anode was formed on the buffer layer by codepositing silver (Ag) and ytterbium (Yb) in a ratio of 14:1.

Example 2

An organic light emitting diode device was manufactured according to the same method as Example 1, except for codepositing Yb and LiF in a ratio of 1:4 to form a buffer layer.

Example 3

An organic light emitting diode device was manufactured according to the same method as Example 1, except for codepositing Ag and Yb in a ratio of 140:4 to form the anode.

Comparative Example 1

An organic light emitting diode device was manufactured according to the same method as Example 1, except for forming a 60 Å-thick buffer layer by codepositing Ag and Yb.

Comparative Example 2

An anode was formed by stacking ITO on a glass substrate and patterning it, a hole injection layer (HIL) was formed on the anode by depositing CuPc, and a hole transport layer (HTL) was formed thereon by depositing NPB, an emission layer was formed by codepositing Alq3 (tris_8-hydroxyquinoline_aluminum) doped with 1 wt % of coumarin 6, an electron transport layer (ETL) was formed by depositing Bepq2 thereon, and then an electron injection layer (EIL) was formed by depositing lithium quinolate thereon. Then, a cathode was formed by depositing Mg and silver (Ag).

Comparative Example 3

An anode was formed by depositing ITO and patterning it on a glass substrate, a hole injection layer (HIL) was formed on the anode by depositing CuPc, a hole transport layer (HTL) was formed on the hole injection layer (HIL) by depositing NPB, an emission layer was formed by codepositing Alq3 (tris_8-hydroxyquinoline_aluminum) doped with 1 wt % of coumarin 6, an electron transport layer (ETL) was formed on the emission layer by depositing Bepq2, and an electron injection layer (EIL) was formed on the electron transport layer (ETL) by depositing lithium quinolate. Subsequently, a cathode was formed by depositing Mg and silver (Ag).

Comparative Example 4

An organic light emitting diode device was manufactured according to the same method as Example 1, except for forming a 2-layered Yb/LiF buffer layer by sequentially depositing Yb and LiF after depositing an electron transport layer (ETL).

Evaluation 1

The current-voltage-luminance (IVL) characteristics of the organic light emitting diode devices according to Example 1 and Comparative Examples 1 and 2 were measured. The current and luminance of the organic light emitting diode devices according to Example 1 and Comparative Examples 1 and 2 were measured at each voltage by changing a driving voltage using a power supplier measuring current (Keithley 238 Current Source Measure Unit), and measuring luminance (Photo Research PR650). The resulting IVL characteristics are provided in the following Table 1.

TABLE 1

| Condition | Driving voltage (V) | Current density (mA/cm$^2$) | Luminance (nit) | Current efficiency (Cd/A) | Luminous efficiency (lm/W) | Color coordinate x | Color coordinate y | Efficiency /y |
|---|---|---|---|---|---|---|---|---|
| Ex. 1 | 4.5 | 13.1 | 632.8 | 4.8 | 3.4 | 0.131 | 0.064 | 75.784 |
|  | 6 | 57.7 | 2748.0 | 4.8 | 2.5 | 0.131 | 0.064 | 74.822 |
| Comp. Ex. 1 | 5 | 10.6 | 581.4 | 5.5 | 3.5 | 0.101 | 0.175 | 31.515 |
|  | 6.5 | 43.8 | 2411.0 | 5.5 | 2.7 | 0.101 | 0.175 | 31.573 |
| Comp. Ex. 2 | 4.5 | 7.4 | 380.3 | 5.1 | 3.6 | 0.129 | 0.070 | 73.165 |
|  | 6 | 35.9 | 1782.0 | 5.0 | 2.6 | 0.129 | 0.070 | 70.852 |

Evaluation 2

Color characteristics of the light emitting diode devices according to Examples 1 to 3 and Comparative Example 3 were measured. The light-emitting color characteristics were measured by using a PR650 luminance meter and Keithley 2400 source measurement unit.

TABLE 2

| | Red (R) | | Green (G) | | Blue (B) | | Expected |
|---|---|---|---|---|---|---|---|
| | R_x | R efficiency | G_x | G efficiency | B_x | B efficiency | W efficiency |
| Ex. 1 | 0.668 | 37.4 | 0.210 | 52.1 | 0.055 | 94.2 | 28.1 |
| Ex. 2 | 0.671 | 38.1 | 0.213 | 55.0 | 0.059 | 93.2 | 28.5 |
| Ex. 3 | 0.661 | 39.7 | 0.215 | 54.7 | 0.062 | 98.4 | 29.5 |
| Comp. Ex. 3 | 0.681 | 34.6 | 0.197 | 55.5 | 0.060 | 100.1 | 29.0 |

The organic light emitting diode devices according to Examples 1 to 3 showed similar light-emitting color characteristics and expected white efficiency to those of the organic light emitting diode device according to Comparative Example 3.

Evaluation 3

Figure 2:
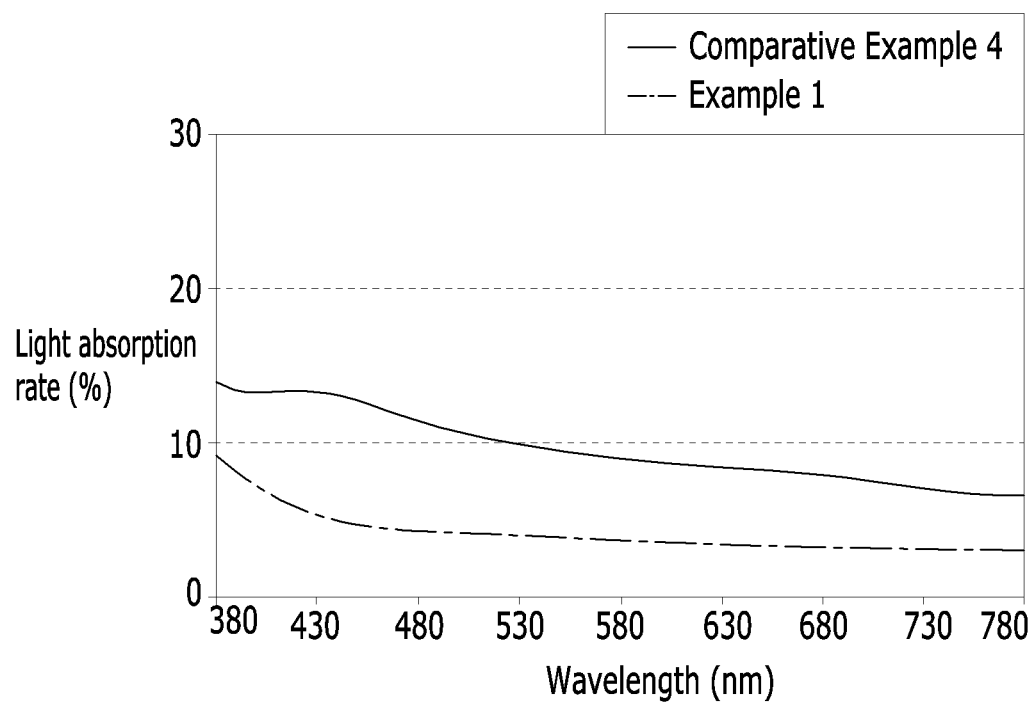
FIG. 2 shows light absorption rates of organic light emitting diode devices according to Example 1 and Comparative Example 4.

The light absorption rate of the organic light emitting diode devices according to Example 1 and Comparative Example 4 were measured by using a UV-visible spectrometer (PerkinElmer® LAMBDA 1050/950/850 UV/Vis & UV/Vis/NIR), and the results are provided in FIG. 2.

FIG. 2 shows the light absorption rates of the organic light emitting diode devices according to Example 1 and Comparative Example 4.

Referring to FIG. 2, the organic light emitting diode device according to Example 1 had a lower light absorption rate than that of the organic light emitting diode device according to Comparative Example 4. Therefore, based on the above results, the organic light emitting diode device according to Example 1 had higher light transmittance than that of the organic light emitting diode device according to Comparative Example 4.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode device, comprising
an anode,
a cathode,
an emission layer between the anode and the cathode, and
a buffer layer positioned between the emission layer and the anode, the buffer layer comprising a first material that is an oxide, fluoride, quinolate, or acetoacetate of an alkaline metal or an alkaline-earth metal, the buffer layer further comprising a second material having a work function in a range from about 2.6 to about 4.5 eV, the buffer layer further having a thickness in a range from about 30 Å to about 400 Å.

2. The organic light emitting diode device of claim 1, wherein the buffer layer comprises amounts of the first material and the second material in a weight ratio having a range from about 1:4 to about 4:1.

3. The organic light emitting diode device of claim 1, wherein the second material comprises any one or more of ytterbium (Yb), aluminum (Al), silver (Ag), and magnesium (Mg).

4. The organic light emitting diode device of claim 1, wherein the first material comprises at least one of LiF, NaF, NaCl, CsF, Li2O, BaO, and lithium quinolate.

5. The organic light emitting diode device of claim 1, further comprising a hole injection layer (HIL) doped with P-type material, the HIL positioned between the buffer layer and the emission layer.

6. The organic light emitting diode device of claim 1, wherein the anode comprises one or more of a transparent conductive layer including a transparent conductive oxide, and a semi-transparent conductive layer having a thickness of about 8 nm to about 30 nm and including aluminum (Al), an aluminum-alloy (Al-alloy), silver (Ag), or a silver-alloy (Ag-alloy).

7. The organic light emitting diode device of claim 1, further comprising at least one organic layer selected from a hole injection layer (HIL), a hole transport layer (HTL), an electron blocking layer (EBL), a hole blocking layer (HBL), an electron transport layer (ETL), and an electron injection layer (EIL).

8. An organic light emitting diode device, comprising
an anode,
a cathode,
an emission layer between the anode and the cathode, and
a buffer layer disposed between the emission layer and the anode, the buffer layer comprising:
a first metal selected from the group consisting of LiF, NaF, NaCl, Li$_2$O, and lithium quinolate, and
a second metal selected from the group consisting of ytterbium (Yb), aluminum (Al), silver (Ag), magnesium (Mg) and Mg/Ag alloy.

9. The organic light emitting diode device of claim 1, wherein the buffer layer comprises amounts of the first metal and the second metal in a weight ratio having a range from about 1:4 to about 4:1.

* * * * *